United States Patent [19]

Koromegawa et al.

[11] Patent Number: 5,177,528
[45] Date of Patent: Jan. 5, 1993

[54] ALIGNING APPARATUS FOR SUBSTRATE

[75] Inventors: Isao Koromegawa, Tsuchiura; Terumi Ogawa, Kashiwa; Masashi Takagaki, Tsukuba; Hironori Toyoshima, Nagareyama, all of Japan

[73] Assignee: Hitachi Techno Engineering Co., Ltd., Tokyo, Japan

[21] Appl. No.: 887,789

[22] Filed: May 26, 1992

[30] Foreign Application Priority Data

May 27, 1991 [JP] Japan .................. 3-120632

[51] Int. Cl.$^5$ ................ G03B 27/32; G01R 31/02
[52] U.S. Cl. .................. 355/53; 324/158 F
[58] Field of Search ............ 355/53; 357/70; 324/158 F; 361/412

[56] References Cited

U.S. PATENT DOCUMENTS

| 4,811,059 | 3/1989 | Harnasaki et al. | 355/53 X |
| 4,958,258 | 9/1990 | Charruau | 361/412 X |
| 4,967,260 | 10/1990 | Butt | 357/70 |
| 5,032,788 | 7/1991 | Ringleb et al. | 324/158 F |

Primary Examiner—Donald A. Griffin
Attorney, Agent, or Firm—Antonelli, Terry, Stout & Kraus

[57] ABSTRACT

The present invention provides an aligning apparatus which is capable of aligning auxiliary connecting plates such as a testing fixture plate so as to fit to both sides of a substrate. A camera 13a monitors aligning marks provided on a substrate 6 and a first auxiliary connecting plate (i.e. a lower surface testing fixture plate) 8 to carry out an aligning operation by moving the substrate 6 by means of an XYΘ table 5. A first plate-fitting member (a vacuum suction member) 32 fixes the substrate 6 and the first auxiliary connecting plate 8. On the other hand, a camera 13b monitors aligning marks provided on the substrate 6 and a second auxiliary connecting plate (i.e. an upper surface testing fixture plate) 11 to carry out an aligning operation by moving the second auxiliary connecting plate 11 by means of the XYΘ table 5. A second plate-fitting member (a vacuum suction member) 33 fixes the substrate 6 and the second auxiliary connecting plate 11. Thus, the auxiliary connecting plates can be accurately aligned on both sides of the substrate through one table.

5 Claims, 5 Drawing Sheets

ALIGNING APPARATUS FOR SUBSTRATE

BACKGROUND OF THE INVENTION

The present invention relates to an aligning apparatus for substrates, and more particularly to an aligning apparatus suitable for accurately aligning auxiliary connecting plates such as a fixture plate for test or a connecting terminal plate so as to fit to both sides of a substrate such as a printed substrate or a ceramic substrate.

To perform an inspection of a printed substrate or a ceramic substrate which are formed with wiring patterns thereon, anisotropic conductive rubber sheets, which resistance values decrease at portions pressed down, are usually disposed at both sides of the substrate. By supplying current while applying pressure to these anisotropic conductive rubber sheets through a fixture plate for test, the inspection as to whether or not there is any open circuit on the substrate or short-circuit of the wiring pattern is carried out. This kind of background art is, for example, disclosed in the Japanese Patent Application Laid-open No. 69-206776.

Furthermore, as disclosed in the Japanese Patent Application Laid-open No. 53-81161, a so-called zebra connector, which is a striped pattern rubber sheet formed by alternately arraying low resistance portions and high resistance portions, is disposed on a substrate to connect with a terminal plate.

Recently, there is a tendency such that wiring patterns are formed finely. Therefore, unless the testing fixture plate is precisely positioned with respect to the substrate or unless the zebra connector is precisely positioned with respect to the terminal plate, a desired conductive circuit cannot be completed. Thus, usage of anisotropic conductive rubber sheets or zebra connectors become meaningless.

Furthermore, there was such a problem that, from the view point of facilitating aligning operation, if wiring pattern was gathered to a blank portion on a substrate so as to expand respective terminal gap, the wiring pattern had to be elongated unusually to gather its terminals to the blank portion and, thus, such an elongation of wiring pattern resulted in increasing frequency of occurrence of open-circuits or short-circuits.

SUMMARY OF THE INVENTION

Accordingly, the present invention has a purpose, in view of above-described problems and disadvantages encountered in the prior art technologies and needs, to provide an aligning apparatus for substrates capable of accurately aligning auxiliary connecting plates such as a testing fixture plate or a connecting terminal plate so as to fit to both sides of a substrate such as a printed substrate or a ceramic substrate.

To accomplish this end, the present invention provides an aligning apparatus for substrates comprising: a basement, a table mounted on said basement so as to be shiftable at least two directions normal with each other; a substrate supporting means mounted on said table for supporting the substrate detachably; a first connecting plate supporting means mounted on said basement for supporting a first auxiliary connecting plate, which is formed with a conductive path fitting to a wiring pattern of said substrate, so that the first auxiliary connecting plate can face to one main surface of the substrate formed with the wiring pattern; a second connecting plate supporting means mounted on said table for detachably supporting a second auxiliary connecting plate, which is formed with a conductive path fitting to the wiring pattern of said substrate, so that the second auxiliary connecting plate can face to the other main surface of the substrate formed with the wiring pattern; a first fitting means between plates for detachably supporting said substrate and said first auxiliary connecting plate; a second fitting means between plates for detachably supporting said substrate and said second auxiliary connecting plate; an image analysis means for analyzing aligning marks provided on said substrate and said first and second auxiliary connecting plates; and a control means for aligning said substrate and said first and second auxiliary connecting plates by actuating said table, said substrate supporting means, said second connecting plate supporting means, and said first and second fitting means between plates, on the basis of output from said image analysis means.

In accordance with the present invention, an aligning operation is carried out as follows.

A substrate is shifted by use of a table, and the substrate and a first auxiliary connecting plate are aligned with each other. And, a first plate-fitting means fixes the substrate and the first auxiliary connecting plate. On the other hand, a second auxiliary connecting plate is shifted by use of the table, and the substrate and the second auxiliary connecting plate are aligned with each other. A second plate-fitting means fixes the substrate and the second auxiliary connecting plate. Thus, both of said first and second auxiliary connecting plates are aligned so as to sandwich said substrate therebetween.

This aligning operation requires only one table, therefore an overall construction becomes simple. Furthermore, the substrate and the first auxiliary connecting plate are already fixed after having been aligned in advance. Therefore, at the timing that the substrate is aligned with respect to the second auxiliary connecting plate, it will not be feared that the first auxiliary connecting plate causes any displacement against the substrate during the aligning operation of the second auxiliary connecting plate against the substrate.

The above and other objects, features and advantages of the present invention will become more apparent from the following detailed description and the appended claims which are to be read in conjunction with the accompanying drawings. However, the drawings are merely illustrative and not restrictive to limit the scope of the invention.

DETAILED DESCRIPTION OF THE PREFERRED EMBODIMENT

Hereinafter, referring now to the accompanying drawings, preferred embodiments of the present invention are explained in detail.

Figure 1:
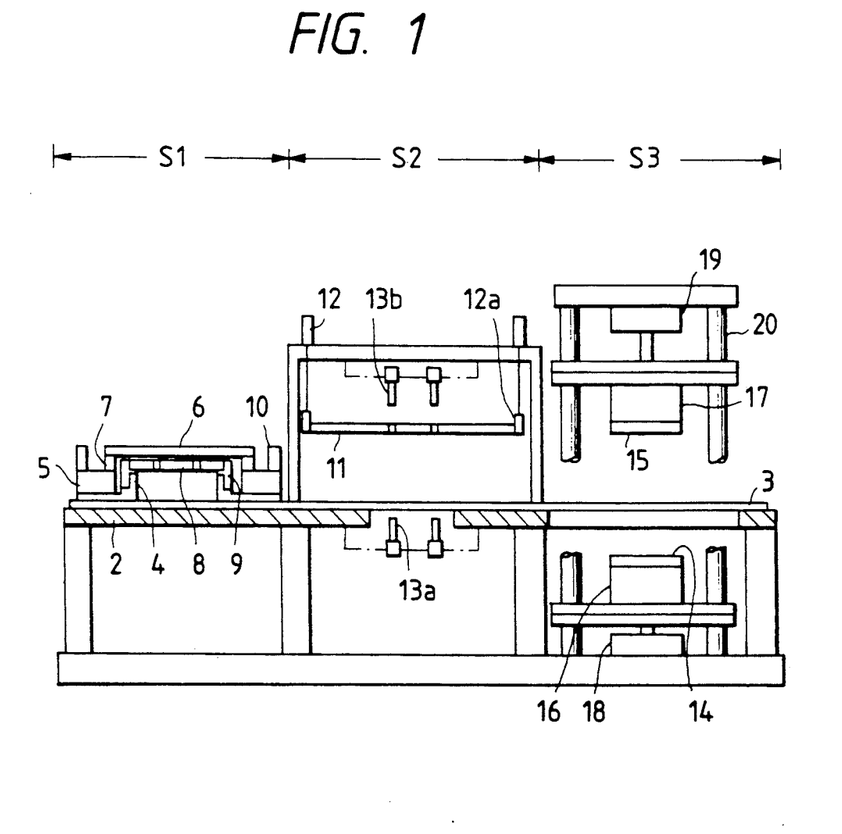
FIG. 1 is a schematic view showing a testing apparatus for printed substrates in accordance with one embodiment of the present invention.

FIG. 1 is a schematic view showing a testing apparatus for printed substrates in accordance with one embodiment of the present invention.

The testing apparatus shown in FIG. 1 is constituted by three sections of a preparing station S1, an aligning station S2, and a testing station S3, which are disposed successively in this order.

A reference numeral 2 denotes a frame. On this frame 2, rails 3 are provided to extend from the station S1 to the station S3. A basement 4 is driven by a driving means such as an air cylinder (not shown) so as to slide on the rails 3 along a right-and-left direction in the drawing. That is, the basement 4 can shift between respective stations S1, S2, and S3.

In the above preparing station S1, a substrate supporting means 7 for detachably supporting an XYΘ table 5 and a printed substrate 6 is mounted on the basement 4. There is provided a lower surface testing fixture plate 8 which serves as a first auxiliary connecting plate being formed with a conductive path corresponding to or fitting to a wiring pattern formed on the lower surface of the printed substrate 6. A first connecting plate supporting means 9 which supports the lower surface testing fixture plate 8 so as to fit to the lower surface of the substrate 6 is also mounted on the basement 4.

Further, as shown in FIG. 1, the printed substrate 6 having an upper surface formed with the wiring pattern thereon can shift from the preparing station S1 to the aligning station S2. An upper surface testing fixture plate 11, which is supported by a supporting means 10 on the basement 4 for a second auxiliary connecting plate disposed on the aligning station S2, is disposed so as to face to the upper surface of the printed substrate 6 having the wiring pattern.

The XYΘ table 5 can shift the printed substrate 6 in any of an X-direction along which the rails 3 extend, a Y-direction which is perpendicular to the drawing surface of FIG. 1, and a Θ-direction along which the printed substrate 6 can rotate on the table 5. There are provided anisotropic conductive rubber sheets, which are described in detail later, on the printed substrate 6 and the lower surface testing fixture plate 8, respectively, though these anisotropic conductive rubber sheets are not shown in FIG. 1.

In the preparing station S1, the printed substrate 6, the lower surface testing fixture plate 8 and the anisotropic conductive rubber sheet are successively piled up on the basement 4 and the XYΘ table 5. In the aligning station S2, there is provided an air cylinder 12 having its lower end being provided with a supporting portion 12a as a means for hanging and elevating the upper surface testing fixture plate 11.

Moreover, there are provided with cameras 13a, 13b which serve as the image analysis means for analyzing aligning marks provided on the printed substrate 6, the lower surface testing fixture plate 8, and the upper surface testing fixture plate 11. These cameras 13a, 13b are ones using electric charge coupled device (i.e. CCD pick-up sensors).

The testing station S3 is provided with boxlike bodies 16, 17 which support standard pattern plates 14, 15 used for the current supply testing by being abutted to the lower and the upper surface testing fixture plates from the lower and the upper directions, respectively. These box-like bodies 16, 17 are shifted by air cylinders 18, 19 in an up-and-down direction. Furthermore, there are provided supporting shafts 20 guiding these box-like bodies 16, 17.

There are provided anisotropic conductive rubber sheets, which are disposed on the upper surface testing fixture plate 11 and the downside standard pattern plate 14, though these anisotropic conductive rubber sheets are not shown in FIG. 1.

In the aligning station S2, an aligning operation between the printed substrate 6 and the upper surface testing fixture plate 8 and the lower surface testing fixture plate 11 is carried out. Then, the basement 4 is further conveyed on the rails 3 toward the testing station S3 to perform an ordinary test for the printed substrate 6.

Figure 2:
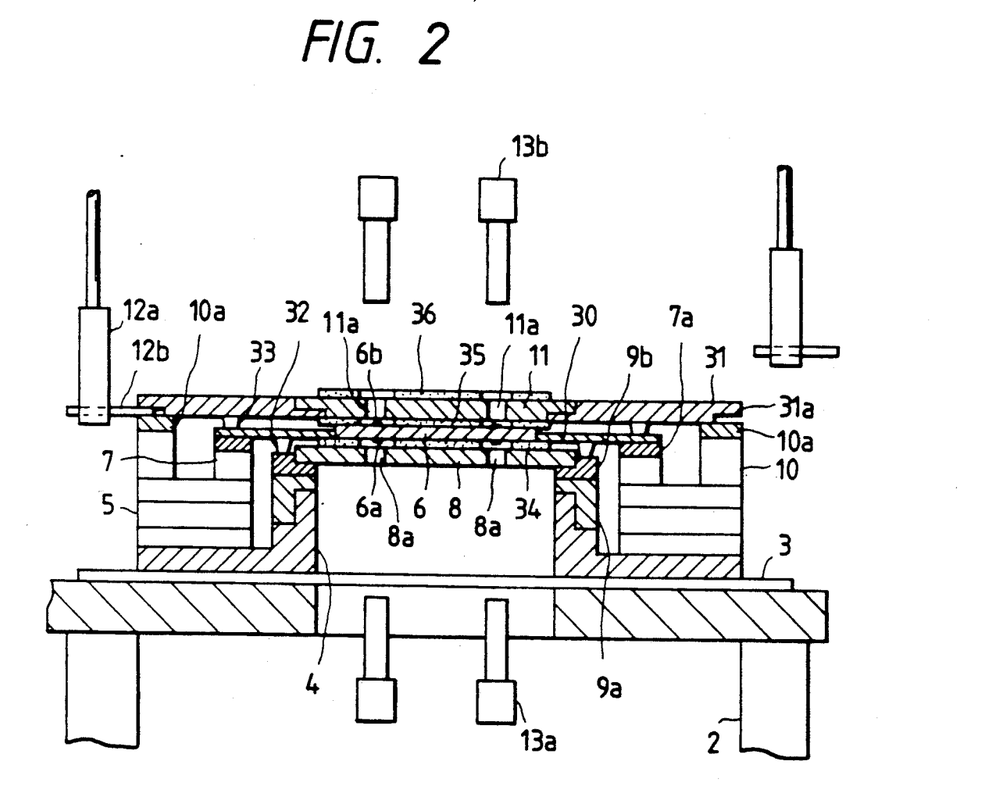
FIG. 2 is a cross-sectional view showing an essential part of an aligning station of the apparatus shown in FIG. 1.

Next, referring to FIG. 2, the aligning operation and the testing operation are explained in detail. FIG. 2 is a cross-sectional view showing an essential part of the aligning station in the apparatus shown in FIG. 1. In this FIG. 2, a reference numeral 9a denotes a sliding member which causes the lower surface testing fixture plate 8 to shift in a vertical direction (Z-direction); i.e. in an up-and-down direction in the drawing. A reference numeral 9b denotes a downside fixture plate holder which is disposed on the sliding member 9a to hold the lower surface testing fixture plate 8. These sliding member 9a and the downside fixture plate 9b constitute the first connecting plate supporting means 9.

The printed substrate 6 is supported through the substrate holder 30 on the substrate supporting means 7. The substrate supporting means 7 includes a vacuum suction portion 7a so as to detachably support the printed substrate 6 by sucking or releasing air.

Furthermore, the upper surface testing fixture plate 11 is supported through the upside fixture plate holder 31 on the second connecting plate supporting means 10. The second connecting plate supporting means 10 includes a vacuum suction portion 10a so as to detachably support the upper surface testing fixture plate 11 by sucking or releasing air.

Reference numerals 32, 33 denote vacuum suction members which serve as the first and the second fitting means between plates for detachably supporting the printed substrate 6 and the upper and lower surface testing fixture plates 8, 11. The vacuum suction member 32 is provided to perform the air suction and release operation between the substrate holder 30 and the downside fixture holder 9b. To the contrary, the vacuum suction member 33 is provided to perform the air suction and release operation between the substrate holder 30 and the upside fixture holder 31.

The supporting portion 12a of the air cylinder 12 comprises an engaging piece 12b which shifts along a right and-left direction in the drawing, so that the engaging piece 12b can engage with a peripheral cutout portion 31a of the upside fixture holder 31 so as to elevate the upper surface testing fixture plate 11 through the upside fixture holder 31. Or, by releasing this engagement and holding the supporting portion 12a at the elevated position, the upper surface testing fixture plate 11 can shift together with printed substrate 6 etc. to the testing station S3, conveyed by the basement 4 as shown in FIG. 1.

The printed substrate 6 has an upper and a lower surface provided with aligning marks 6a, 6b. Reference numerals 34, 35, and 36 denote anisotropic conductive rubber sheets. These anisotropic conductive rubber sheets 34, 35, and 36 and the lower and upper surface testing fixture plates 8, 11 are provided with openings 8a and 11a so as to correspond to the aligning marks 6a, 6b of the printed substrate 6, so that the cameras 13a, 13b can analyze images of the aligning marks 6a, 6b.

The XYΘ table 5 is constituted by a Θ-axis table causing a shift movement in a Θ-direction, a Y-axis table causing a shift movement in Y-direction, and an X-axis table causing a shift movement in X-direction, which are piled up in this order on the substrate 4.

After the anisotropic conductive rubber sheet 35 is laid on the printed substrate 6 at the preparing station S1, the basement 4 is conveyed to the aligning station S2. In this instance, the supporting portion 12a is positioned at the elevated position so that the supporting portions 12a interfere with the shift movement of the basement 4.

In the same manner as two supporting portions 12a shown in right and left sides of FIG. 2, there are provided two engaging pieces 12b, 12b at the right and left sides of FIG. 2. Furthermore, there are provided the upper surface testing fixture plate 11, the anisotropic conductive rubber sheet 36 are provided between respective one supporting portion 12a and one engaging portion 12b through the upside fixture holder 31.

When the basement 4 is conveyed to the aligning station S2, the supporting portion 12a is lowered until the upside fixture holder 31 abuts to the vacuum suction portion 10a. Then, after the upside fixture holder 31 has reached the vacuum suction portion 10a, the engaging piece 12b is removed from the supporting portion 12a. Then, the supporting portion 12a is returned to the elevated portion.

In FIG. 2, the left-hand supporting portion 12a is in its lowered condition and the right-hand supporting portion 12a is in its elevated condition.

The lower surface testing fixture plate 8 is fixed on the basement 4 by the downside fixture holder 9b. In this condition, first of all, the substrate holder 30 is sucked by the vacuum suction portion 7a so as to fix the printed substrate 6 on the XYΘ table 6. In this instance, other vacuum suction portions 10a and vacuum suction members 32, 33 are released.

Using camera 13a, the aligning mark 6a on the printed substrate 6 is image-picked up through the opening 8a of the lower surface testing fixture plate 8 together with the opening 8. The aligning operation of the printed substrate 6 and the lower surface testing fixture plate 8 is carried out in such a manner that the center of the aligning mark 6a is positioned to conform with the center of the opening 8a. Then, after finishing this aligning operation, the printed substrate 6 and the lower surface testing fixture plate 8 are fixed together firmly so as not to cause any mutual displacement, by actuating the vacuum suction member 32. Subsequently, the vacuum suction member 7a is released.

Next, the vacuum suction portion 10a is actuated to suck the upside fixture holder 31 so that the upper surface testing fixture plate 11 can be fixed on the XYΘ table 5. Using the camera 13b, in the same way as the previous description, the printed substrate 6 and the upper surface testing fixture plate 11 are aligned with each other by utilizing the aligning mark 6b and the opening 11a. After that, the vacuum suction member 33 fixes the printed substrate 6 and the upper surface testing fixture plate 11 so as not to displace with each other.

And, in turn, the vacuum suction portion 10a is released.

In such an aligning operation, in order to suppress friction caused between respective plates of the printed substrate 6, the lower surface testing fixture plate 8, and the upper surface testing fixture plate 11 by means of the anisotropic conductive rubber sheets 34, 35, or in order to improve the operation of the vacuum suction portions 7a, 10a and the vacuum suction members 32, 33, it is preferable to accommodate elevation means such as an air cylinder in the substrate supporting means 7 and the second connecting plate supporting means 10. Though it is not shown in the drawing, such an elevation means would be constituted to raise or lower the substrate holder 30 and the upside fixture holder 31 in the Z-direction; i.e. an elevation direction of the supporting portion 12a. In the aligning operation or the fixing operation by use of suction, this elevation means would be controlled to slightly move the substrate holder 30 and the upside fixture holder 31, respectively.

In accordance with the embodiment of the present invention, the lower surface testing fixture plate 8 and the upper surface testing fixture plate 11 are accurately aligned so as to fit to both sides of the printed substrate 6, using a single XYΘ table 5. After having finished the aligning operation at the aligning station S2, the basement 4 is conveyed on the rails 3 toward the testing station S3.

Figure 3:
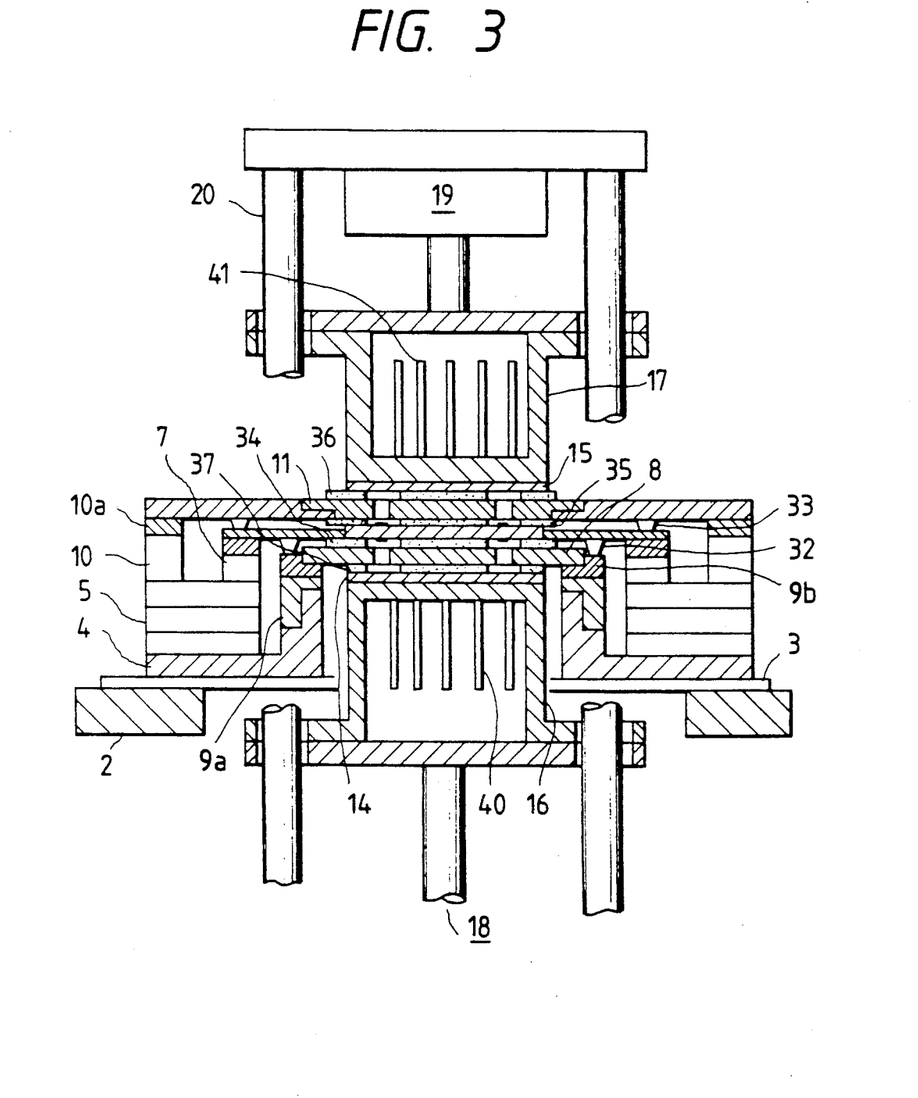
FIG. 3 is a cross-sectional view showing an essential part of a testing station of the apparatus shown in FIG. 1.
Figure 4:
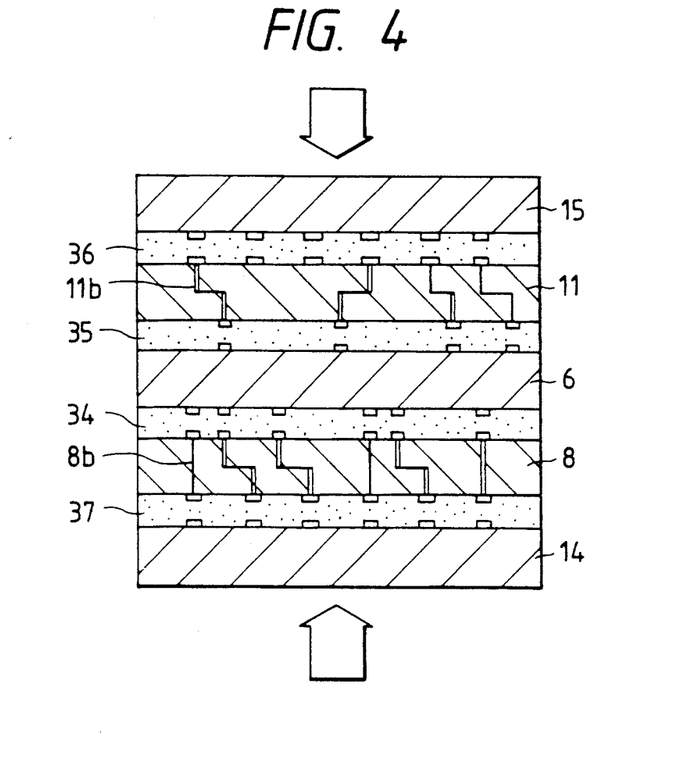
FIG. 4 is an enlarged cross-sectional view showing a current supply condition in a printed substrate and its surroundings during a testing.

Next, the detailed constitution of the testing station S3 and its function are explained, referring to FIGS. 3 and 4.

FIG. 3 is an enlarged cross-sectional view of an essential part of the testing station in the apparatus shown in FIG. 1. FIG. 4 is an enlarged cross-sectional view showing a current supply condition in the printed substrate and its surroundings during a test.

FIG. 3 illustrates the condition wherein boxlike bodies 16, 17 are elevated by the air cylinders 18, 19 along the supporting shafts 20 in order to perform the test. There are provided stoppers at the rightmost end of the rails 3, though they are not shown in the drawing. Accordingly, the conveyed basement 4 is stopped by these stoppers so as to automatically position at a predetermined position.

Next, the box-like body 16 is raised by the air cylinder 18. The anisotropic conductive rubber sheet 37 is mounted on the downside standard pattern 14. This anisotropic conductive rubber sheet 37 contacts with the lower surface of the lower surface testing fixture plate 8. Further, as the box-like body 16 rises, the sliding member 9a rises slidingly with respect to the basement 4. In this case, if the substrate supporting means 7 and the second connecting plate supporting means 10 include elevation means, it would be preferable to actuate these elevation means so as to raise the printed substrate 6 and the upper surface testing fixture plate 11 with their horizontal conditions being kept.

When the anisotropic conductive rubber sheet 36 abuts the upside standard pattern 15 and each of the anisotropic conductive rubber sheets 34, 35, 36, and 37 are sufficiently pressed, the box-like body 16 is stopped. By the way, the box-like body 17 can be lowered by the air cylinder 19 in accordance with the rising movement of the box-like body 16.

FIG. 4 illustrates the condition wherein the printed substrate 6 is pressed on both its sides by the downside standard pattern 14 and the upside standard pattern 15.

In FIG. 4, the downside standard pattern 14 and the upside standard pattern 15 are formed with wiring patterns on their up and down surfaces, respectively. When the printed substrate 6 is tested, these downside standard pattern 14 and upside standard pattern 15 are commonly used. The lower surface testing fixture plate 8 and the upper surface testing fixture plate 11 are changed based on various printed substrate 6. Their current supply path is also changed so that any current supply can be realized in accordance with testing items. Reference numerals 8b, 11b denote internal wiring utilized for above-described changes.

The anisotropic conductive rubber sheets 34, 35, 36, and 37 have such property that their resistances suddenly decrease at the strongly pressed portions. Therefore the current supply circuit can be easily formed by forcibly sandwiching them by the box-like bodies 16, 17.

Since the printed substrate 6 is conveyed into the testing station S3 after having been performed an accurately aligning operation at the aligning station S2, even if the printed substrate 6 has a fine wiring pattern, any desired test can be carried out with respect to the printed substrate 6.

Each of the box-like bodies 16 and 17 accommodates testing circuit boards 40, 41 therein, so that wiring number can be reduced.

Next, referring to FIG. 5, described hereinafter is an explanation of an electrical control system for shifting the basement 4 between the preparing station S1 and the testing station S3.

Figure 5:
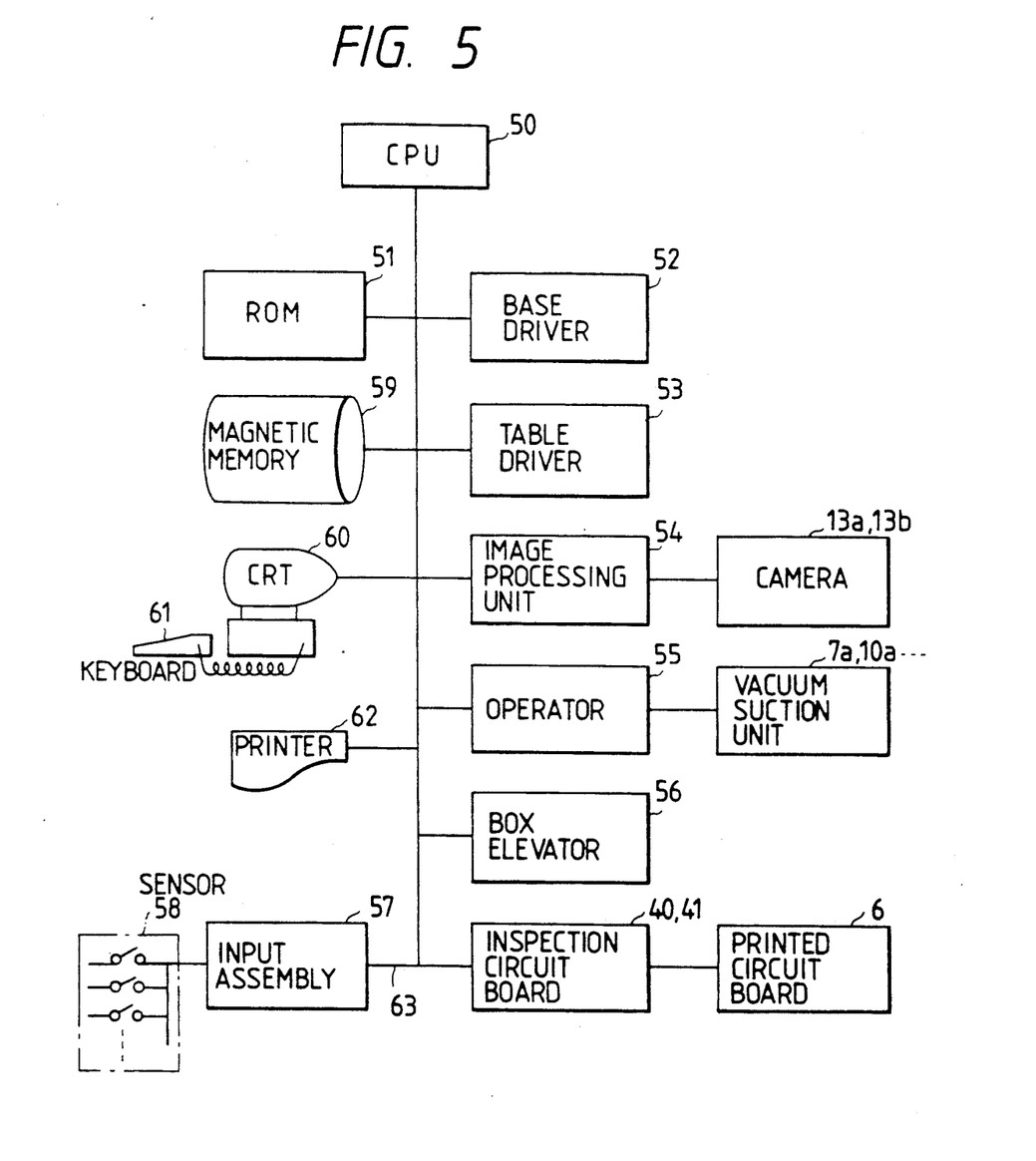
FIG. 5 is a block diagram showing an electrical control system in the apparatus shown in FIG. 1.

FIG. 5 is a block diagram showing the electrical control system adopted for the apparatus shown in FIG. 1.

In FIG. 5, a reference numeral 50 denotes a central processing unit (CPU). Based on a processing program stored in a ROM 51, this CPU 50 exchanges data with any of an actuating portion (i.e. a base driver) 52 of the air cylinder shifting the basement 4, an actuating portion (i.e. a table driver) 53 of the table 5, an image processing unit 54 for analyzing output image of the cameras 13a, 13b, an operator 55 for the vacuum suction portions 7a, 10a, the vacuum suction members 32, 33, an elevating portion (a box elevator) 56 for the box-like bodies 16, 17, and an input assembly 57 for various sensors 58 which detect whether or not various portions reach the predetermined positions and inspection circuit boards 40, 41 for the printed circuit board 6 through a bus 63.

Exchanged data are stored in the memory 59, and can be displayed on a display portion 60 as occasion demands. Or, an instruction of operation is inputted through a keyboard 61. And, a printer 62 can output memorized data.

The program stored in the ROM 51 relates to a sequence control for controlling actions of various portions which are previously described, and not related to the highly-advanced logic judgement. Thus, its explanation is omitted here.

When the test is finished, the box-like body 16 of FIG. 3 is lowered. Then, after the lower surface testing fixture plate 8 contacts with the downside fixture holder 9b, when the box-like body 16 is positioned at a position under the frame 2 shown in FIG. 1, the basement 4 stops once at the aligning station S2. The upper surface testing fixture plate 11 is lifted together with the upside fixture plate holder 31 by the engaging piece 12b of the supporting portion 12a. In turn, the basement 4 is returned to the preparing station S1 to stand by for a next test.

In the above embodiment, though the aligning operation for the printed substrate 6 and the lower surface testing fixture plate 8 is carried out after the upper surface testing fixture plate 11 is lowered, it is of course possible to perform the aligning operation of the printed substrate 6 and the lower surface testing of fixture plate 8 in advance and, subsequently, to lower the upper surface testing fixture plate 11 so as to perform the aligning operation against the substrate 6 by use of the camera 13b shown in FIG. 2.

Furthermore, in the case where the supporting portion 12a can be widely shifted in the vertical direction, the preparing station can be omitted. In this case, loading and taking out of the printed substrate 6 and the anisotropic conductive rubber sheets 34 to 36 in the aligning operation can be carried out at the aligning station S2.

Moreover, instead of the anisotropic conductive rubber sheets 36, 37 sandwiched between the lower and the upper surface testing fixture plates 8, 11 and the downside and the upside standard pattern plates 14, 15, it is possible to provide a plurality of probes at predetermined portions of the downside and the upside standard pattern plates 14, 16 so that these probes can contact with the predetermined wiring pattern on the lower and the upper side surface testing fixture plates 8, 11.

Figure 6:
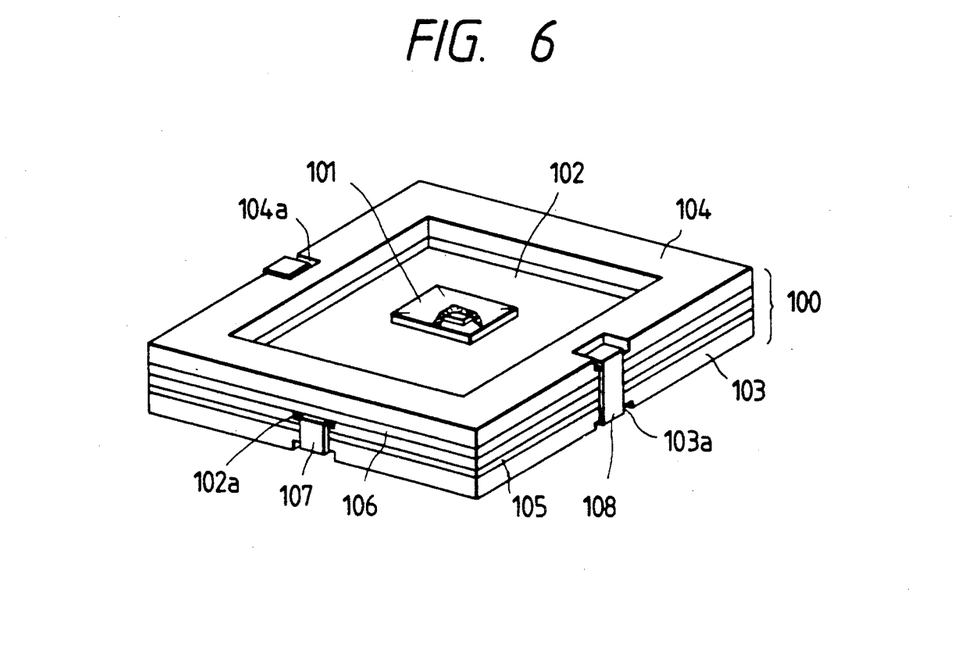
FIG. 6 is a perspective view showing a contained hybrid module in accordance with other embodiment of the present invention.

Next, another embodiment of the present invention is explained referring to FIG. 6.

In this embodiment, the present invention is applied to an aligning operation in manufacturing a hybrid module. An LSI element 101 of a surface packing type and so on are mounted on a ceramic substrate 102. This ceramic substrate 102 is sandwiched by an upper and a lower connecting terminal plates 103, 104 through anisotropic conductive rubber sheets 105, 106. Then, plate-fitting members 107, 108 fix them by applying pressure so as to contain them in this condition.

If the apparatus of FIG. 6 is compared with the apparatus of FIG. 2 (i,e, the aligning station for the printed substrate testing apparatus), the ceramic substrate 102 corresponds to the printed substrate 6. The lower and the upper connecting terminal plates 103 and 104 correspond to the lower and the upper surface testing fixture plates 8 and 11, respectively. Further, the plate-fitting members 107, 108 correspond to vacuum suction members 32 and 33.

The plate-fitting members 107 and 108 are U-shaped members, when seen from the side, having spring function. The open end portions of these plate-fitting members 107 and 108 are, first of all, slightly extended to further open their U-shape, and are inserted into fixing cutout portions 102a, 103a, and 104a so that these plate-fitting members 107 and 108 can fix these laminated layers 100 by being sprung back when the open end portions are released.

Though the plate-fitting member 108 shown in FIG. 6 is engaged between the lower and the upper connecting terminal plates 103, 104, it is also preferable to engage this plate-fitting member 108 between the ceramic substrate 102 and the upper connecting terminal plate 104.

In aligning in a testing apparatus, the ceramic substrate 102 and the upper connecting terminal plate 104 are aligned in such a manner that their cutouts (not shown) are engaged with holders corresponding to the substrate holder 30 and the upper fixture holder 31 shown in FIG. 2. And then, the plate-fitting member 107 not only serves as the vacuum suction member 32 of FIG. 2 as previously described, but serves as a fastener member for the container or a press-fitting member for rubber sheet 105.

Though the rubber sheets 36, 37 shown in FIG. 3 are not shown in the embodiment of FIG. 6, after having finished the aligning operation in the aligning station S2 and forming the container of the laminated layers 100, an ordinary test is carried out at the testing station S3. Then, the peripheral portion of the container is sealed by resin coating so that plate-fitting members 107, 108 can be burred in the resin coating. Thus, the fixing by the plate-fitting members 107, 108 become permanent.

For this embodiment, the testing station serves as device for confirming that the lower and the upper connecting terminal plates 103 and 104 are accurately aligned with respect to the ceramic substrate 102, rather than the testing section for the ceramic substrate 102.

Though two embodiments are shown, the aligning apparatus of the present invention can be applied to various assemblies which are required to accurately pile up three plates.

The present invention can be reduced into practice in the following aspects.

(1) An aligning apparatus wherein the XYΘ table 5 shifts in both of the X and the Y directions in the case where holders do not cause significant error in the Θ direction.

(2) An aligning apparatus wherein things on the basement 4 are disposed perpendicular in the drawing of FIG. 2, and the basement 4 can be shifted so as to stride over the box-like body 16 under the condition the box-like body 16 protrudes on the upper surface of the frame 2, in the case where a lower box-like body 16 is required to suppress its upward shifting amount at the testing station S3.

(3) An aligning apparatus wherein soldering bumps of the printed substrate 6, the first auxiliary connecting plate (i.e. the lower surface testing fixture plate) 8, and the second auxiliary connecting plate (i.e. the upper surface testing fixture plate) 11 are directly connected in the case where the anisotropic conductive rubber sheet are not adopted.

(4) An aligning apparatus wherein the printed substrate 6, the first auxiliary connecting plate (i.e. the lower surface testing fixture plate) 8, and the second auxiliary connecting plate (i.e. the upper surface testing fixture plate) 11 are mutually connected by the zebra connector instead of the anisotropic conductive rubber sheet.

(5) An aligning apparatus wherein the image pick-up cameras 13a, 13b are disposed to be shiftable in the horizontal direction so that the aligning marks laterally arrayed on each of the printed substrate 6, the first auxiliary connecting plate (i.e. the lower surface testing fixture plate) 8, and the second auxiliary connecting plate (i.e. the upper surface testing fixture plate) 11 can be analyzed to calculate a deviation of the aligning operation based on the lateral distance obtained from the image processing unit so as to adjust the aligning operation.

As is explained in detail in the foregoing description, according to the present invention, it becomes possible to provide an aligning apparatus for substrates which is capable of accurately aligning auxiliary connecting plates such as a testing fixture plate or a connecting terminal plate so as to fit to both sides of the substrate.

Having now fully described the present invention, it will be apparent to one of ordinary skill in the art that many changes and modifications can be made thereto without departing from the spirit and scope of the present invention as set forth herein.

What is claimed is:

1. An aligning apparatus for substrates comprising:
a basement;
a table mounted on said basement so as to be shiftable at least in the rectangular direction;
a substrate supporting means mounted on said table for detachably supporting the substrate;
a first connecting plate supporting means mounted on said basement for supporting a first auxiliary connecting plate which is formed with a conductive path fitting to wiring pattern of said substrate, so that the first auxiliary connecting plate is opposed to one main surface of the substrate formed with the wiring pattern;
a second connecting plate supporting means mounted on said table for detachably supporting a second auxiliary connecting plate which is formed with a conductive path fitting to the wiring pattern of said substrate, so that the second auxiliary connecting plate is opposed to the other main surface of the substrate formed with the wiring pattern;
a first fitting means between plates for detachably supporting said substrate and said first auxiliary connecting plate;
a second fitting means between plates for detachably supporting said substrate and said second auxiliary connecting plate;
an image analysis means for analyzing aligning marks provided on said substrate and said first and second auxiliary connecting plates; and
a control means for aligning said substrate and said first and second auxiliary connecting plates by actuating said table, said substrate supporting means, said second connecting plate supporting means, and said first and second fitting means between plates, on the basis of output from said image analysis means.

2. An aligning apparatus for substrates according to claim 1, wherein which said table mounted on the basement can shift in a rotational direction.

3. An aligning apparatus for substrates comprising:
a basement;
a table mounted on said basement so as to be shiftable at least in the rectangular direction;
a substrate supporting means mounted on said table for detachably supporting the substrate;
a first auxiliary connecting plate being mounted on said basement so as to be opposed to one main surface of the substrate formed with the wiring pattern, and further being formed with a conductive path fitting to the wiring pattern of said substrate;
a connecting plate supporting means mounted on said table for detachably supporting a second auxiliary connecting plate which is formed with a conductive path fitting to the wiring pattern of said substrate, so that the second auxiliary connecting plate is opposed to the other main surface of the substrate formed with the wiring pattern;
a fitting means between plates for detachably supporting said substrate and said first auxiliary connecting plate;

an image analysis means for analyzing aligning marks provided on said substrate and said first and second auxiliary connecting plates; and a control means for aligning said substrate and said first and second auxiliary connecting plates by actuating said table, said substrate supporting means, said connecting plate supporting means, and said fitting means between plates, on the basis of output from said image analysis means.

4. An aligning apparatus for substrates according to claim 3, wherein said table mounted on the basement can shift in a rotational direction.

5. An aligning apparatus for substrates wherein aligning marks provided on a first and a second auxiliary connecting plates which are disposed on both sides of a substrate are image-analyzed, and said auxiliary connecting plates are mutually shifted to be aligned with respect to the substrate, said aligning apparatus comprising:

a basement;

a table mounted on said basement so as to be shiftable at least in the rectangular direction;

said first auxiliary connecting plate being mounted on said basement and said second auxiliary connecting plate being mounted to be positioned on the substrate;

a first and a second fitting means for fixing between said substrate and said first auxiliary connecting plate and between said substrate and said second auxiliary connecting plate; and said table being shifted so that said substrate and said first and second auxiliary connecting plates can be aligned.

* * * * *